(12) United States Patent
Mankinen et al.

(10) Patent No.: US 10,798,469 B2
(45) Date of Patent: Oct. 6, 2020

(54) CABLE MANAGEMENT SYSTEM AND APPARATUS FOR PORTABLE RACK-MOUNTED ELECTRONICS

(71) Applicant: IAP WORLDWIDE SERVICES INC., Cape Canaveral, FL (US)

(72) Inventors: Carl E. Mankinen, Saint Johns, FL (US); Hans C. Mankinen, Middleburg, FL (US)

(73) Assignee: IAP WORLDWIDE SERVICES, INC., Cape Canaveral, FL (US)

( * ) Notice: Subject to any disclaimer, the term of this patent is extended or adjusted under 35 U.S.C. 154(b) by 0 days.

(21) Appl. No.: 15/699,606

(22) Filed: Sep. 8, 2017

(65) Prior Publication Data

US 2018/0199117 A1   Jul. 12, 2018

Related U.S. Application Data

(60) Provisional application No. 62/445,659, filed on Jan. 12, 2017.

(51) Int. Cl.
*H04Q 1/06* (2006.01)
*H04Q 1/14* (2006.01)
(Continued)

(52) U.S. Cl.
CPC .............. *H04Q 1/062* (2013.01); *H04Q 1/064* (2013.01); *H04Q 1/09* (2013.01); *H04Q 1/142* (2013.01);
(Continued)

(58) Field of Classification Search
CPC .......... H04Q 1/062; H04Q 1/064; H04Q 1/09; H04Q 1/142; H05K 7/1491; G02B 6/4452
See application file for complete search history.

(56) References Cited

U.S. PATENT DOCUMENTS

| 5,653,070 A * | 8/1997 | Seguin | F16F 15/02 248/621 |
| 6,601,932 B1 * | 8/2003 | Helgenberg | H02B 1/301 211/26 |

(Continued)

FOREIGN PATENT DOCUMENTS

GB           2092804           8/1982

OTHER PUBLICATIONS

"Amazon Cases & Racks" (2016) located at https://cpcases.com/content/uploads/2016/05/Amazon-v2.3-Low.pdf; 13 pages.

(Continued)

*Primary Examiner* — Patrick D Hawn
(74) *Attorney, Agent, or Firm* — Morrison & Foerster LLP

(57) ABSTRACT

A cable management apparatus for a portable rack-mounted electronics enclosure includes a first arm portion configured to mount the apparatus to the portable rack-mounted electronics enclosure, a second arm portion rotationally coupled to the first arm portion, the second arm portion comprising a guide configured for guiding cables routed to electronics housed within the portable rack-mounted electronics enclosure, and a latch mounted to the first arm portion or the second arm portion, the latch being movable to a latched position for preventing rotation of the second arm portion relative to the first arm portion and to an unlatched position for allowing rotation of the second arm portion relative to the first arm portion.

21 Claims, 11 Drawing Sheets

(51) Int. Cl.
   *H04Q 1/02* (2006.01)
   *H05K 7/14* (2006.01)
   *G02B 6/44* (2006.01)

(52) U.S. Cl.
   CPC ......... *H05K 7/1491* (2013.01); *G02B 6/4452* (2013.01)

(56) References Cited

U.S. PATENT DOCUMENTS

| | | | | |
|---|---|---|---|---|
| 6,613,981 | B1* | 9/2003 | Hathcock | H02G 3/045 174/100 |
| 6,805,248 | B2* | 10/2004 | Champion | H05K 7/1491 211/26 |
| 6,814,244 | B1* | 11/2004 | Hathcock | E05D 15/502 211/26 |
| 7,097,047 | B2* | 8/2006 | Lee | H05K 7/1449 211/26.2 |
| 7,637,773 | B2* | 12/2009 | Shifris | H01R 9/2416 439/540.1 |
| 8,167,146 | B2* | 5/2012 | Yu | H05K 7/1491 211/175 |
| 8,246,382 | B1 | 8/2012 | Ku et al. | |
| 8,387,933 | B2* | 3/2013 | Yu | H05K 7/1491 211/26 |
| 8,730,678 | B1* | 5/2014 | Cunningham | H05K 7/1491 174/72 A |
| 8,965,168 | B2* | 2/2015 | Cowen | G02B 6/4452 385/135 |
| 9,075,217 | B2* | 7/2015 | Giraud | G02B 6/4452 |
| 9,212,765 | B1 | 12/2015 | Chia et al. | |
| 9,519,118 | B2* | 12/2016 | Giraud | G02B 6/4452 |
| 10,036,865 | B2* | 7/2018 | Franco Romo | E05D 3/02 |
| 10,067,308 | B2* | 9/2018 | Smith | G02B 6/4452 |
| 10,126,513 | B2* | 11/2018 | Wells | G02B 6/4452 |
| 10,267,080 | B1* | 4/2019 | Lamb | E05F 17/004 |
| 2001/0031124 | A1* | 10/2001 | McGrath | H04Q 1/064 385/134 |
| 2003/0026084 | A1 | 2/2003 | Lauchner | |
| 2004/0074852 | A1* | 4/2004 | Knudsen | G02B 6/4452 211/26 |
| 2004/0146266 | A1* | 7/2004 | Solheid | G02B 6/3897 385/135 |
| 2004/0216911 | A1 | 11/2004 | Franz et al. | |
| 2006/0071581 | A1 | 4/2006 | Harvey | |
| 2006/0118321 | A1 | 6/2006 | Herring et al. | |
| 2007/0189691 | A1* | 8/2007 | Barth | G02B 6/4452 385/135 |
| 2007/0221393 | A1* | 9/2007 | Adducci | E05C 9/043 174/50 |
| 2008/0079341 | A1* | 4/2008 | Anderson | G02B 6/4452 312/287 |
| 2008/0085094 | A1* | 4/2008 | Krampotich | G02B 6/4455 385/135 |
| 2009/0038845 | A1 | 2/2009 | Fransen et al. | |
| 2011/0132855 | A1 | 6/2011 | Papakos et al. | |
| 2011/0268406 | A1* | 11/2011 | Giraud | G02B 6/4452 385/135 |
| 2015/0103488 | A1 | 4/2015 | Tanaka | |
| 2015/0275557 | A1 | 10/2015 | Adair et al. | |
| 2015/0370025 | A1* | 12/2015 | Wells | G02B 6/4452 385/135 |
| 2016/0040467 | A1* | 2/2016 | Hwang | F25D 23/028 312/405 |
| 2017/0061095 | A1* | 3/2017 | Waskin | G06F 19/3462 |
| 2018/0231730 | A1* | 8/2018 | Geens | G02B 6/4452 |

OTHER PUBLICATIONS

International Search Report and Written Opinion dated Jul. 2, 2018, directed to International Application No. PCT/US2017/060624; 29 pages.
Invitation to Pay Additional Fees dated Feb. 6, 2018, directed to International Application No. PCT/US2017/060624; 15 pages.

* cited by examiner

CABLE MANAGEMENT SYSTEM AND APPARATUS FOR PORTABLE RACK-MOUNTED ELECTRONICS

CROSS-REFERENCE TO RELATED APPLICATION

This application claims the benefit of U.S. Provisional Application No. 62/445,659, filed Jan. 12, 2017, the entire contents of which is incorporated herein by reference.

FIELD OF THE INVENTION

This disclosure relates generally to enclosures for computing systems and more specifically to cable management for portable rack-mounted computing systems.

BACKGROUND OF THE INVENTION

As more facilities, companies, and organizations rely on IT and communications equipment to perform daily operations, a need often arises for temporary computing and telecommunications installations. For example, temporary computing and telecommunications installations may be needed on a temporary basis in battlefields, disaster areas, construction areas, and so on. Establishing such temporary installations poses many challenges including transportation of sensitive equipment to the temporary location and assembly of the installations in non-ideal or even harsh environments.

Various types of containers for transporting and handling computing and telecommunications equipment for temporary installations are utilized in military and commercial environments. For example, military environments often utilize rugged containers that can be moved fairly often and provide substantial protection from a variety of conditions, including high vibration loads, high impact loads, large temperature differentials, large pressure differentials, and humidity extremes. The computing and telecommunications equipment is packaged in the containers, unpackaged and installed at the temporary site, and re-packaged for further transportation.

Installing the computing and telecommunications equipment once on site can be a difficult and time-consuming task, especially when multiple computing and telecommunications modules must be interconnected. In permanent computing and telecommunications installations, it is well known to assemble multiple computing and telecommunications modules into a high capacity installation by mounting the computing and telecommunications modules, each contained in its own housing, in a larger housing called a "rack." The rack is usually vertically oriented so that the modules are mounted in a stacked arrangement. Electrical or optical cables may be used to interconnect one module to another. Since installations may require extensive cabling to interconnect multiple modules within a stack and between stacks, various cable management components and assemblies may be used to manage cable routing through the rack(s).

A problem with rack mounted installations is that they may be difficult and time consuming to assemble and may not be suitable to the harsh environments of battlefields, disaster areas, constructions areas, etc. Moreover, many conventional cable management systems associated with permanent rack-mounted computing installations involve complex assemblies that are difficult to install. These assemblies may include loose hardware such as nuts, bolts, or other fasteners that may be time-consuming to install and may be easily lost. Further, these conventional cable management assemblies may lack adequate strength and stability for temporary installations in environments that are not ideal for installing computing systems.

BRIEF SUMMARY OF THE INVENTION

According to some embodiments, portable rack-mounted electronic equipment cases housing rack-mounted computing and telecommunications modules are stacked to form a computing and telecommunications installation or portion thereof. Each case can include a cable management arm mounted at the opening of the case. Stored computing modules can be pre-wired and the cables routed from one case to the next using the cable management arms in deployed positions. Upon disassembly of the installation, cables can be disconnected at one end but remain connected to the modules within a case at the other end. The free ends may be coiled and stowed within a cable conduit portion of the arm. The arm can be folded inward so that the case cover can be closed, protecting the sensitive equipment within for transportation, handling and storage.

When establishing a computing installation in the field, the cable management arm, with the connected wiring stored within, folds outward and locks in place. The deployed arms of multiple stacked cases can each include cable routing guides, such as conduits, that align to form a continuous vertical cable raceway. The cable management arms can be configured to be sturdy and secure in the deployed position to protect the cables routed within.

According to some embodiments, a cable management apparatus for a portable rack-mounted electronics enclosure includes a first arm portion configured to mount the apparatus to the portable rack-mounted electronics enclosure, a second arm portion rotationally coupled to the first arm portion, the second arm portion comprising a guide configured for guiding cables routed to electronics housed within the portable rack-mounted electronics enclosure, and a latch mounted to the first arm portion or the second arm portion, the latch being movable to a latched position for preventing rotation of the second arm portion relative to the first arm portion and to an unlatched position for allowing rotation of the second arm portion relative to the first arm portion.

In any of these embodiments, the apparatus may include a lock for locking the latch in the latched and unlatched positions. In any of these embodiments, the lock may include a pin configured for insertion into a hole in the latch.

In any of these embodiments, when the latch is in the unlatched position, the hole in the latch may align with a hole in the first arm portion or the second arm portion, and the pin may be configured to be inserted through the hole in the latch and into the hole in the first arm portion or the second arm portion to lock the latch in the latched position.

In any of these embodiments, the lock may include a detent for retaining the lock in a locking position. In any of these embodiments, the apparatus may include a hinge for coupling the second arm portion to the first arm portion.

In any of these embodiments, the first arm portion may align with the second arm portion along a joint and the latch may bridge at least a portion of the joint when in the latched position.

In any of these embodiments, the second arm portion may rotate away from the enclosure from a folded position to an extended position in which the latch prevents rotation of the second arm portion relative to the first arm portion when in the latched position.

In any of these embodiments, the enclosure may include a rack for mounting modular computing components. In any of these embodiments, the enclosure may be a portable case for transporting rack-mounted modular computing components mounted to the rack.

In any of these embodiments, the enclosure may include one or more shock mountings for protecting housed electronics from mechanical shock. In any of these embodiments, the enclosure may include a cover that can be installed to cover an opening of the enclosure when the second arm portion is rotated relative to the first arm portion toward the opening of the enclosure.

In any of these embodiments, the cables may include data communication cables. In any of these embodiments, the guide may include a channel. In any of these embodiments, the guide may include a plate comprising retainers for retaining the cables to the plate.

According to some embodiments, a portable enclosure for transporting rack-mounted electronics includes a housing, a cover configured to attach to the housing to close the enclosure, and a cable management arm mounted to the housing, the cable management arm including: a first arm portion configured to mount the arm to the housing, a second arm portion rotationally coupled to the first arm portion, the second arm portion comprising a guide configured for guiding cables routed to electronics housed within the enclosure, and a latch mounted to the first arm portion or the second arm portion, the latch being movable to a latched position for preventing rotation of the second arm portion relative to the first arm portion and to an unlatched position for allowing rotation of the second arm portion relative to the first arm portion.

In any of these embodiments, the second arm portion may be configured to rotate to a folded position to allow the cover to attach to the housing to close the enclosure. In any of these embodiments, the enclosure may include a rack. In any of these embodiments, the enclosure may include one or more shock mountings for protecting housed electronics from mechanical shock.

In any of these embodiments, the enclosure may include a cover that is configured to cover an opening of the enclosure when the second arm portion is rotated relative to the first arm portion toward the opening of the enclosure.

According to some embodiments, a portable rack-mounted electronics system includes at least two cases stacked in a stacking direction, wherein each case comprises a cable management arm mounted to the case and extending from an opening of the case, the cable management arm comprising a guide configured for guiding cables routed to electronics enclosed within the case, wherein the guides of the stacked cases align when the cable management arms of the stacked cases are in an extended position.

In any of these embodiments, the guides of the stacked cases may align to form a raceway extending in the stacking direction.

According to some embodiments, a cable management apparatus for a portable rack-mounted electronics enclosure includes a first arm portion configured to mount the apparatus to the portable rack-mounted electronics enclosure; a second arm portion rotationally coupled to the first arm portion, the second arm portion comprising a guide configured for guiding cables routed to electronics housed within the portable rack-mounted electronics enclosure; a first latch for preventing rotation of the second arm portion relative to the first arm portion when the second arm portion is in a first extended position; and a second latch for preventing rotation of the second arm portion relative to the first arm portion when the second arm portion is in a second extended position.

In any of these embodiments, the first latch may include a slider that is configured to span a joint between the first arm portion and the second arm portion to prevent rotation of the second arm portion relative to the first arm portion when the second arm portion is in the first extended position.

In any of these embodiments, the second latch may include a first receptacle in the first arm portion and a second receptacle in the second arm portion, the first and second receptacles configured to align when the second arm portion is in the second extended position and to receive a pin for preventing rotation of the second arm portion relative to the first arm portion when the second arm portion is in a second extended position. In any of these embodiments, the first latch may be configured to receive the pin for locking the first latch in position.

DETAILED DESCRIPTION OF THE INVENTION

Figure 1:
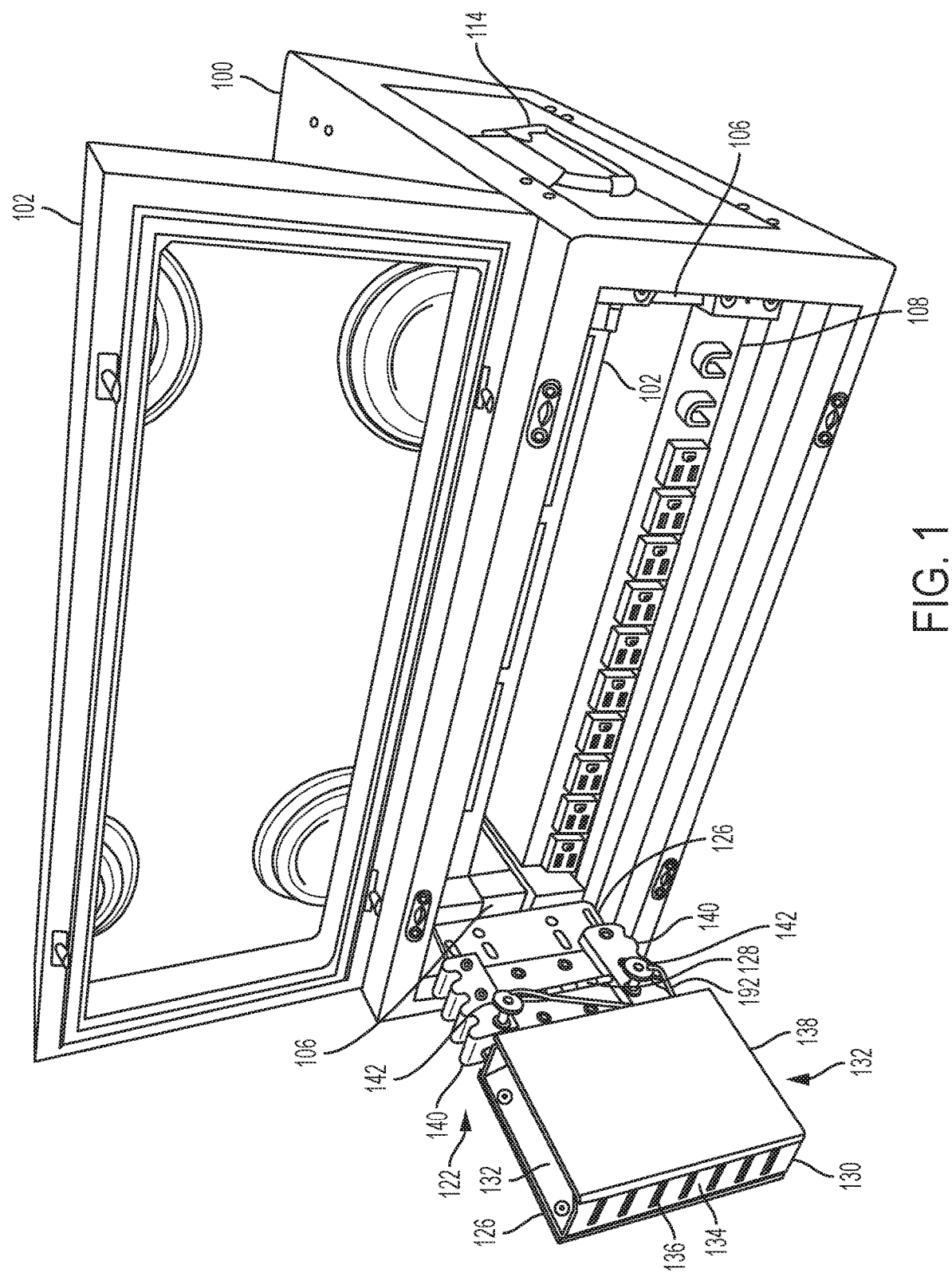
FIG. 1 is a perspective view a portable rack-mounted electronics case with attached cable management arm in a deployed position, according to some embodiments.

Described herein are systems and apparatuses for cable management for portable rack-mounted electronics installations. According to some aspects, cable management arms are mounted to each of a plurality of stacked cases that are configured to store rack mounted electronic modules. An end of each case includes an opening for accessing the fronts of housed rack-mountable electronic modules. The cable management arms extend outwardly from the openings of the cases in deployed positions. Each cable management arm includes a cable guide, with the aligned guides of the arms of stacked cases forming a substantially continuous vertically oriented guide along which cables can be routed. Cables interconnecting electronic modules are routed from connections at the modules, along the cable management arms, along the guide, and to other modules within the stack or adjacent stacks.

Prior to assembly of the stack and for disassembly of the stack, cables can be disconnected at one end while remaining connected to the electronic modules at the other end. The free ends can be looped within the conduit of a cable management arm for stowing. The arm can be folded inwardly ninety degrees toward the opening of the case in a stowed position. With the arm in the stowed position, a cover of the case can be attached to protect the electronics modules within for storage, transportation, handling, etc.

When the case is installed in the field at the next location, the cable management arm, with the connected wiring stored within, folds outward and may lock in place. Thus, cables pre-connected to the electronics in a case can be easily routed to the next case via the aligned channel and quickly connected to the equipment in an adjacent case. The cable management arms can be configured to be sturdy and secure in the deployed position to protect the cables routed within.

In the following description of the disclosure and embodiments, reference is made to the accompanying drawings in which are shown, by way of illustration, specific embodiments that can be practiced. It is to be understood that other embodiments and examples can be practiced, and changes can be made without departing from the scope of the disclosure.

In addition, it is also to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes," "including," "comprises," and/or "comprising," when used herein, specify the presence of stated features, integers, steps, operations, elements, components, and/or units, but do not preclude the presence or addition of one or more other features, integers, steps, operations, elements, components, units, and/or groups thereof.

FIGS. 1-6 illustrate cable management arm 122 mounted onto case 100. Case 100 can be configured with a rack 106 for mounting rack-mountable computing system modules, such as computing module 104 and power module 108. Case 100 can be a rugged, stackable and interlocking carrying case configured to carry conventional rack mounted electronics. Case 100 can be configured to be assembled at a remote site to provide military personnel, and the like, access to a variety of rack mounted computing modules for the purpose of communications, networking, data storage, logistics, etc. Case 100 is configured to allow access to rack-mounted electronics housed within without requiring that the electronics be removed from case 100.

Case 100 can include a cover 102 that is removed for accessing electronic housed within the case, such as conventional (e.g., 19 inch) rack mounted electronics modules, and handles 114 for carrying the case 100. Case 100 can be configured to include any custom or conventionally configured rack onto which housed rack-mountable electronics can be mounted. Shock isolating components can be used to protect the electronics from shocks imparted to the case during transportation and handling. The case 100 can house any type of electronic or electrical components, such as rack mounted electronics for communications, data storage, networking, power, and the like.

Embodiments of case 100 can have any size and shape, for example, to house various equipment or combinations of equipment. Case 100 may be sized based on standard rack sizes, such as 19-inch racks in multiples of standard rack units (typically defined as 1.75 inches in height). Rack 106 within case 100 can be configured as a standardized rack, such as a 19-inch rack of any multiple of a standard rack unit (e.g., 3U, 5U, 7U, 11U, etc.)

Figure 7:
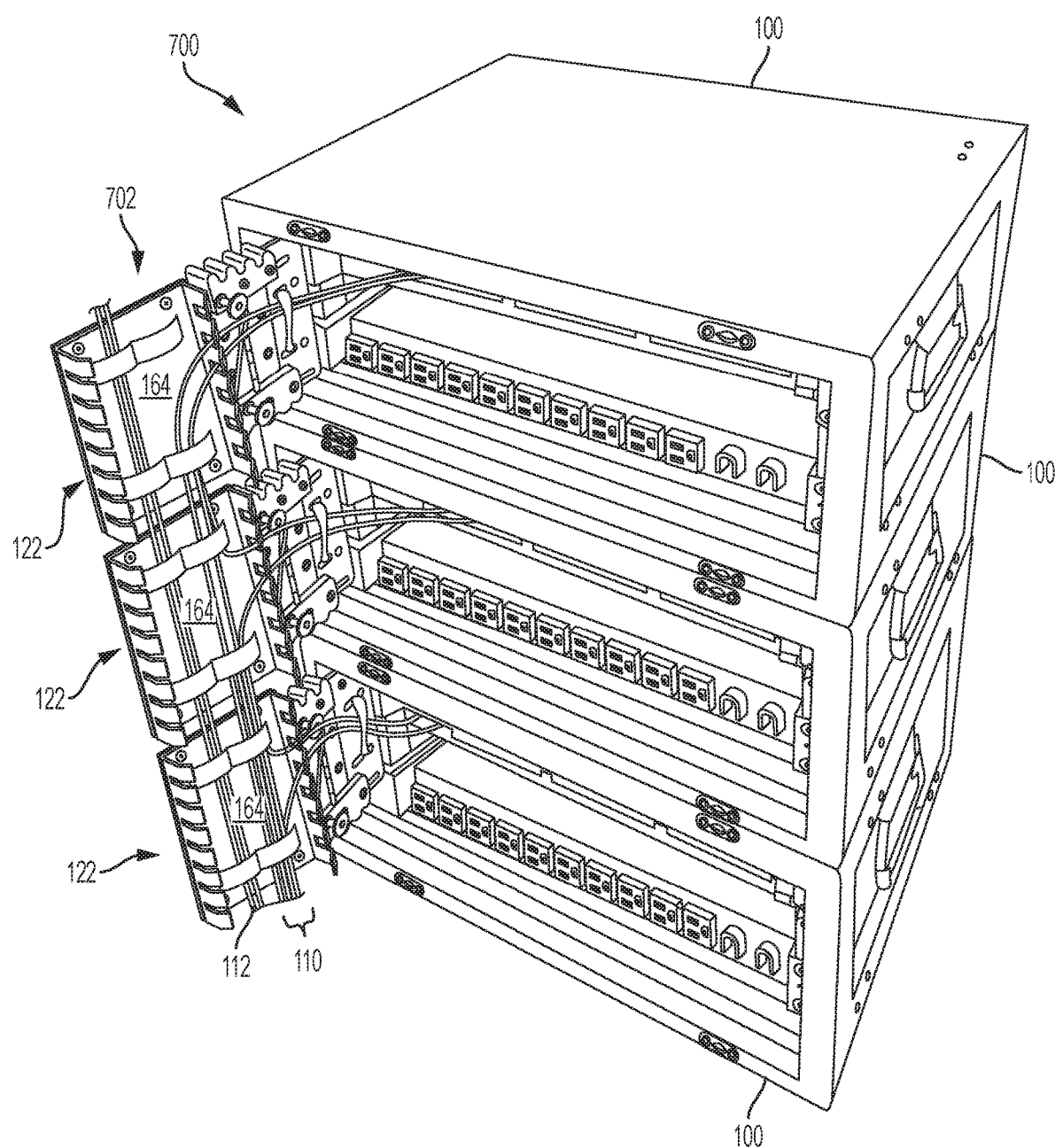
FIG. 7 illustrates a portable rack-mounted electronics system with multiple stacked cases and multiple arms in deployed positions forming a substantially continuous raceway for running cables, according to some embodiments.

Cable management arm 122 is mounted to case 100 to manage cables connected to electronics housed within case 100. Cable management arm 122 includes a first arm portion 124 for mounting to case 100 and a second arm portion 126 that is rotatably connected to the first arm portion 124 by hinge 128. The second arm portion 126 includes a guide in the form of a conduit 130 for routing cables. The upper and lower ends 132 of the conduit 130 are open to allow cable to be run vertically from one conduit 130 to the next when multiple cable management arms 122 are vertically aligned, such as when multiple cases 100 are vertically stacked and the cable management arms 122 are extended (for example, as depicted in FIG. 7 and described below). One or more sides 134 of the conduit 130 include slots 136 configured to enable cables to be routed into and out of the conduit 130. In some embodiments, one or more slots 136 are configured as retainers to retain the cables within the slots, for example, by having a slot width that is smaller than the diameter of the cables. The conduit 130 can include a cover 138 to retain and protect cables running through conduit 130.

Figure 2:
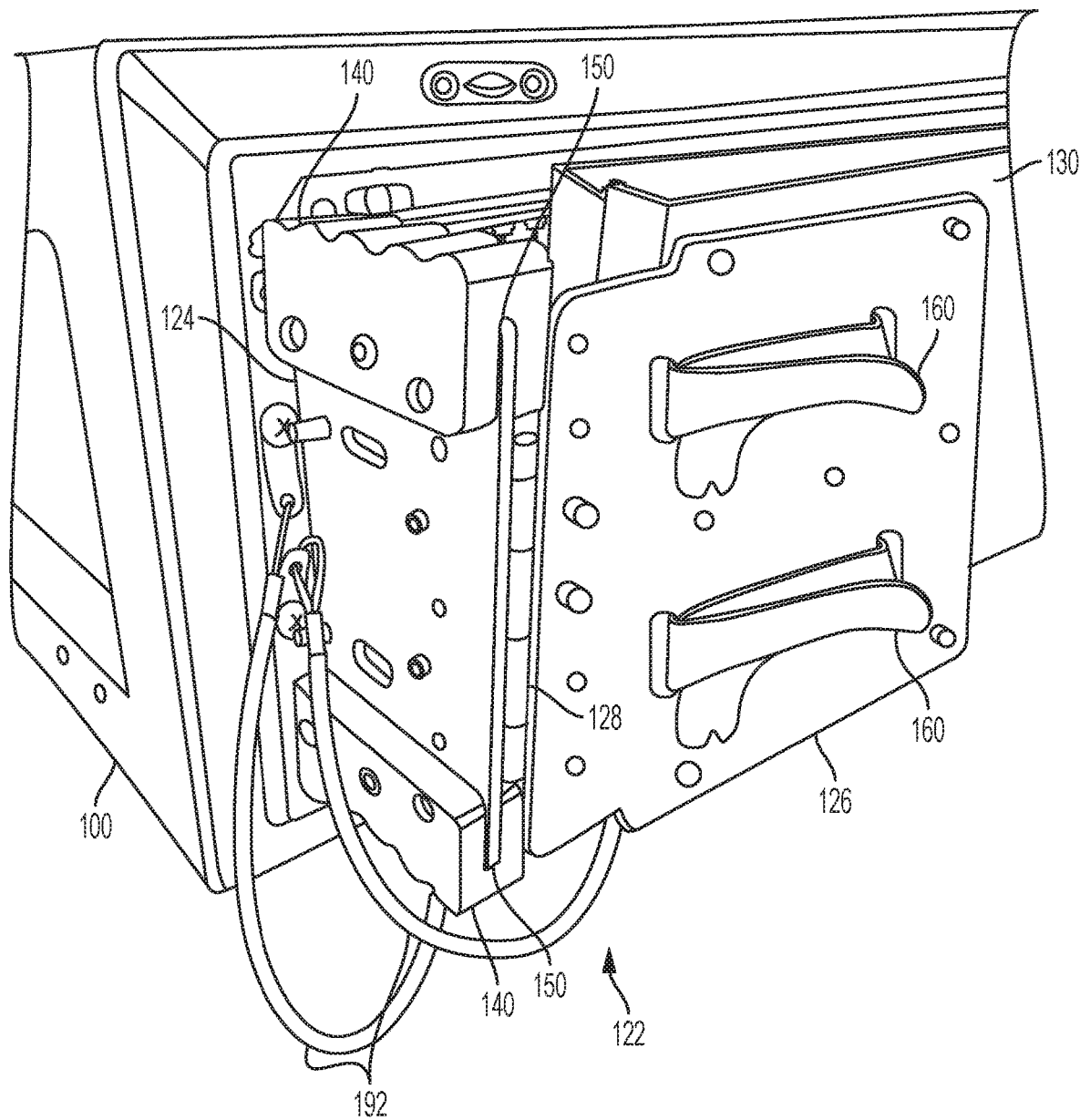
FIG. 2 illustrates a portion of the case and cable management arm of FIG. 1 showing cable management arm in a stowed position, according to some embodiments.

The cable management arm 122 is shown in its deployed position in FIG. 1. In this deployed position, the second arm portion 126 is rotated away from the case 100 such that it extends outwardly from the opening of the case 100 and aligns with the first arm portion 124. To fix the second arm portion 126 in this deployed position, cable management arm 122 includes two latches 140 that are shown in FIG. 1 in a latched position. In the latched position, the latches 140 extend across the joint between the first and second arm portions 124,126 to immobilize hinge 128. Locking pins 142 are configured to be inserted into holes in latches 140 and aligned holes in second arm portion 126. When inserted in the locked position, these locking pins 142 prevent the latches 140 from sliding away from the latched position. Lanyards 192 may be attached at one end to locking pins 142 and at another end to a portion of the cable management arm 122 or the case 100 (as shown in FIG. 2) to secure the locking pins 142 so that they are not dropped or lost when removed from the latches 140. Although shown with two latches 140, cable management arm 122 may include a single latch 140.

When locking pins 142 are not inserted into the latches 140, latches 140 can slide inwardly toward the interior of the case 100 such that the latches 140 no longer bridge the joint between the first and second arm portions 124,126, allowing the second arm portion 126 to be rotated relative to the first arm portion 124. The second arm portion 126 can be rotated inwardly toward the opening in the case 100 to a stowed position. This stowed position is illustrated in FIG. 2, which shows the side of cable management arm 122 opposite to that shown in FIG. 1. When the second arm portion 126 is in this stowed position, the cover 102 of the case 100 can be assembled onto the case 100 to protect the enclosed components (e.g., for shipping, handling, storage, etc.). The latches 140 can be locked in the unlatched position by inserting locking pins 142 into the holes in latches 140, which align with corresponding holes in the first arm portion 124. In some embodiments, the operation of the latches 140 is reversed such that the latches 140 are mounted on the second arm portion 126 and slide onto the first arm portion 124 to the latched position.

As shown in FIG. 2, the latches 140 include u-shaped slots 150 for fitting over the top 152 and bottom 154 of the first arm portion 124. When the second arm portion 126 is rotated outwardly in the deployed position, the latches 140 can be moved to the latched position shown in FIG. 1 by sliding the latches 140 forward over the top 156 and bottom 158 of the second arm portion 126 such that the top 156 and bottom 158 fit into the u-shaped slots 150. Portions of hook-and-loop straps 160 can be seen on the back side (the side facing away from the opening of case 100) of the second arm portion 126 in FIG. 2. These straps 160 loop through holes or slots in the second arm portion 126 and the conduit 130 for strapping cables routed within conduit 130.

Figure 3:
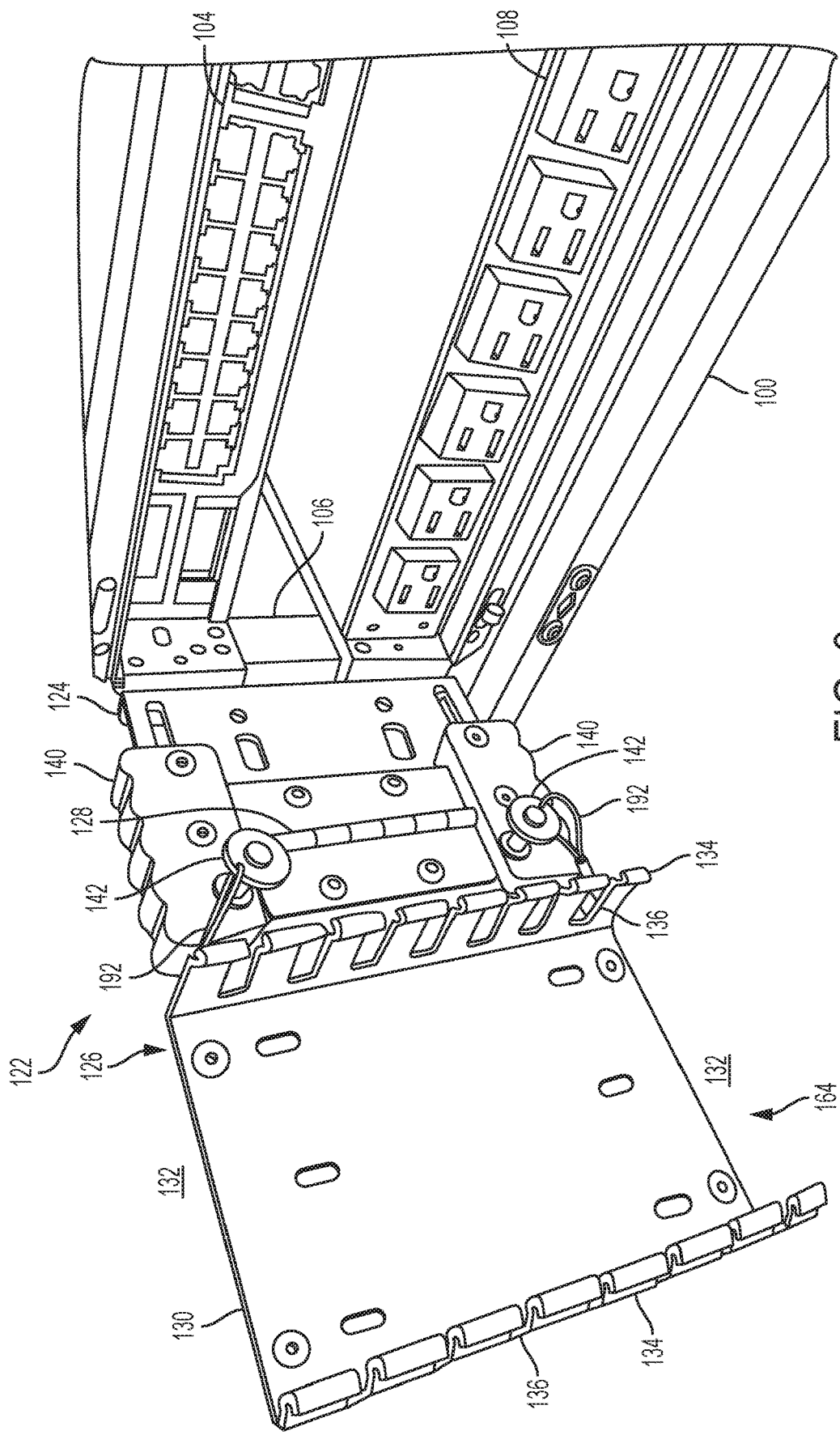
FIG. 3 is a close-up view of the case and arm of FIG. 1 with the arm in the deployed position and the cover of the cable routing conduit on the arm removed, according to some embodiments.

FIG. 3 is a close-up view of cable management arm 122 in the deployed position with the cover 138 of the cable conduit 130 removed. The upper and lower ends 132 of the conduit 130 are open, forming a channel 164 (also referred to as a raceway) that allows for cables to be routed upward or downward to adjacent conduits of the cable management arms of cases stacked above or below. As illustrated, both the inner and outer sides 134 of the conduit 130 include slots 136 for routing and retaining cables. In some embodiments, only one side, such as the inner side facing the hinge 128, includes slots 136 for routing and retaining cables.

Figure 4:
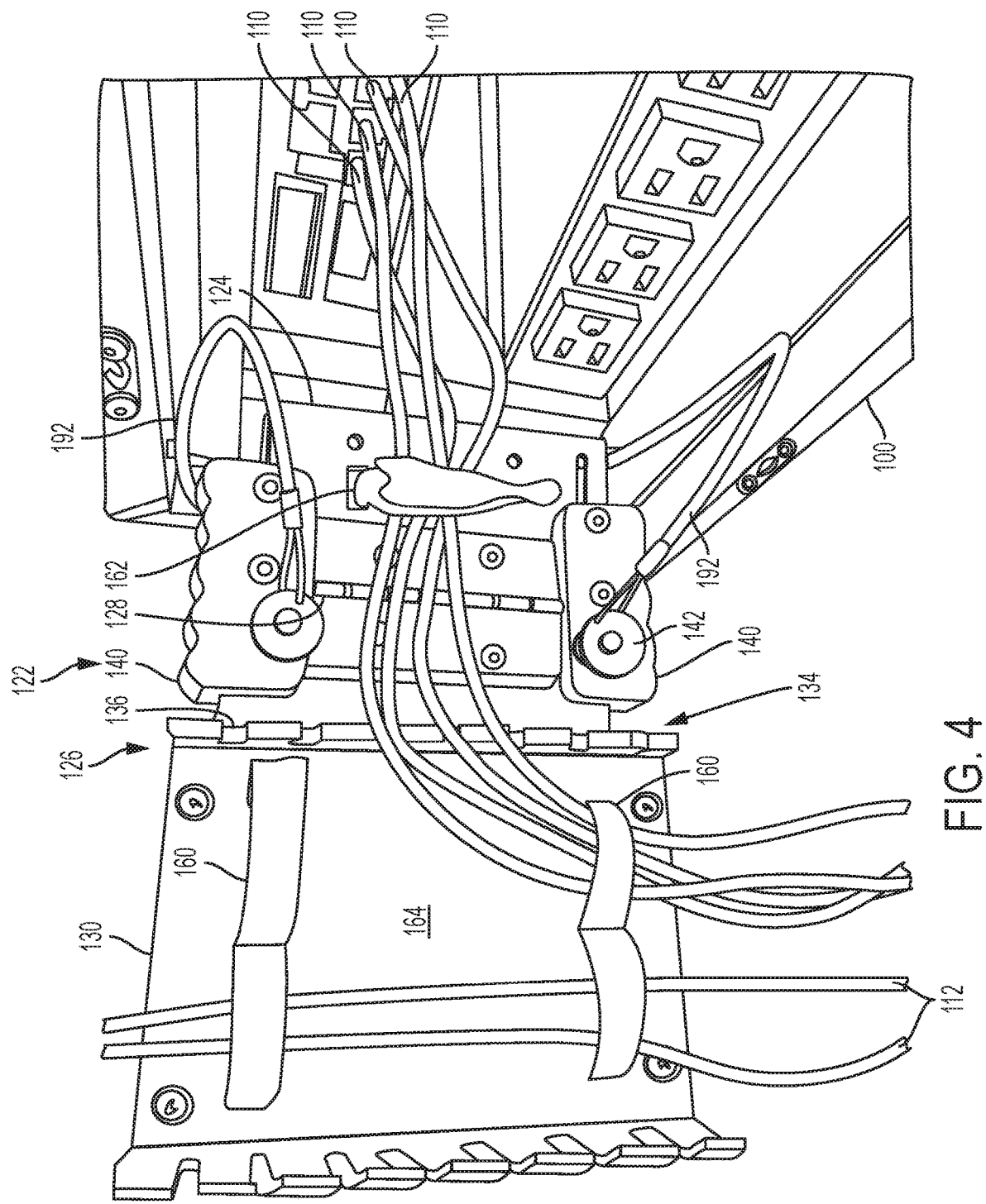
FIG. 4 illustrates the routing of cables through the case and arm of FIG. 1 with the arm in the deployed position, according to some embodiments.

FIG. 4 illustrates cable management arm 122 in the deployed position with cables 110 being routed through cable management arm 122 in an exemplary manner. First ends of cables 110 are connected to computing module 104. The cables 110 are strapped to first arm portion 124 with straps 162 which are looped through slots in first arm portion 124. Cables 110 run across hinge 128 and through slots 136 on the side 134 of conduit 130. The cables 110 continue down along channel 164, for example, to be routed to termination points in electronics in another case or other location. Also running along channel 164 are cables 112 running vertically, which illustrates that conduit 130 can be used to route bypassing cables. Cables 110 and 112 can be strapped to conduit 130 via straps 160.

Figure 5:
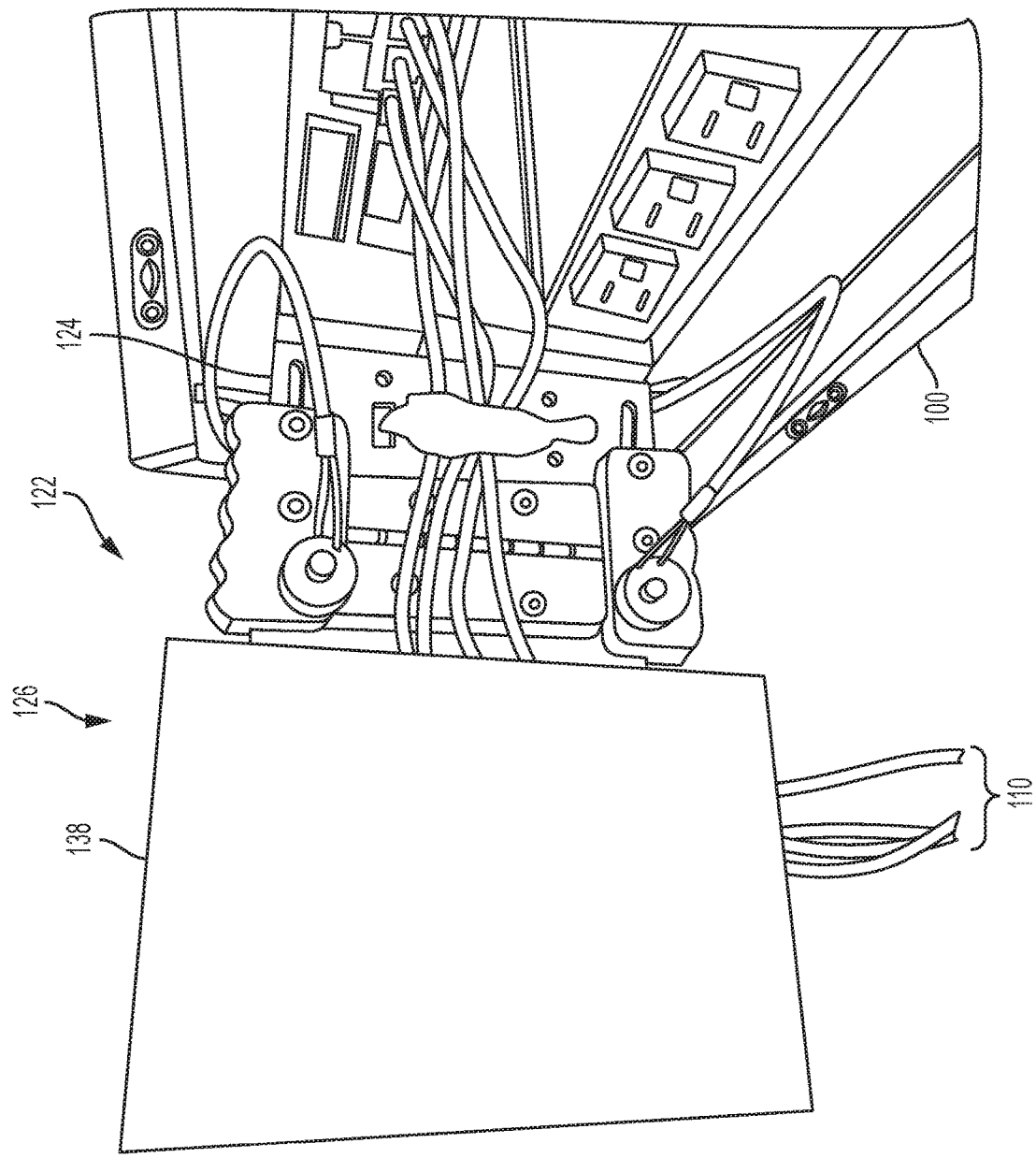
FIG. 5 illustrates the routing of cables through the case and arm as in FIG. 4 but with the cover attached to the cable routing conduit, according to some embodiments.

FIG. 5 illustrates cable management arm 122 with cover 138 attached to conduit 130. Cover 138 may be attached when the cable management arm 122 is in the deployed position, for example, once the cables have been properly routed to protect the cables. The cover 138 may be configured to snap onto conduit 130 for easy removal or may bolt onto 130 for more permanently enclosing the cables housed within. Any other conventional attachment means may be used to attach the cover to the conduit. For example, the cover may be attached to the conduit via a hinge.

Figure 6:
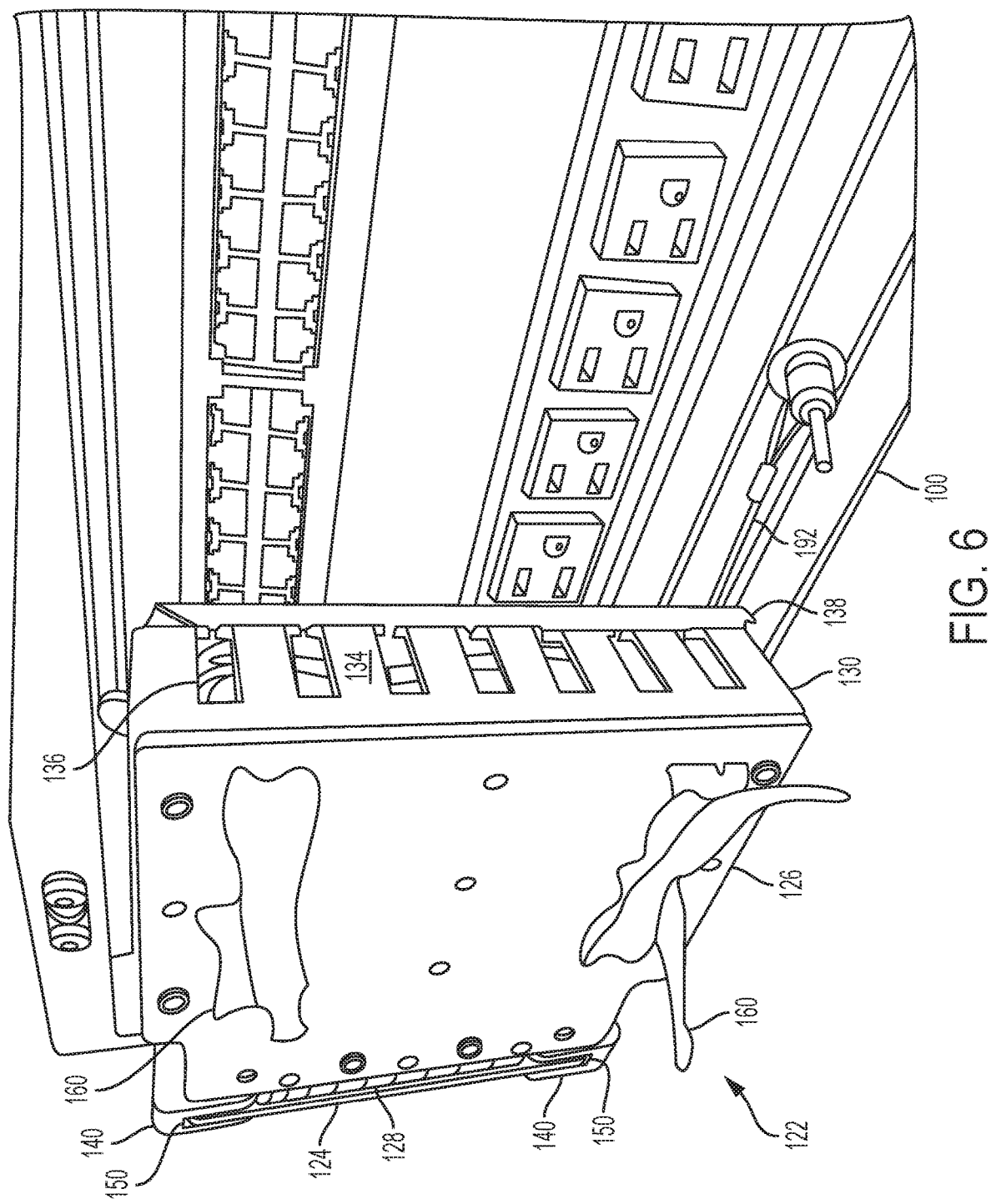
FIG. 6 illustrates the cable management arm of FIG. 1 in its stowed position with cables looped and stowed within, according to some embodiments.

FIG. 6 illustrates the cable management arm 122 in the stowed position in which the second arm portion 126 is folded inward toward the opening in case 100. In this embodiment, second arm portion 126 folds ninety degrees to the stowed position. As illustrated, the latches 140 are retracted toward the case 100 into their unlatched positions such that they no longer bridge the hinged joint between the first and second arm portions 124,126.

Cables 110 connected to electronics modules mounted within case 100 may be looped within conduit 130 in this stowed position, as illustrated. The cover 138 may be attached to conduit 130 to retain the looped cables within. Cables 110 may be strapped as illustrated in FIG. 5 such that when the second arm portion 126 is folded inward, the cables largely maintain their routing positions. Thus, cables 110 are stowed in an organized manner. With the cable management arm 122 in its stowed position, the cover 102 of case 100 can be attached to case 100 and case 100 can be transported, stored, etc.

Once in the field, a complete rack-mounted electronics installation can be assembled to meet the necessary computing requirements of a particular situation by stacking multiple cases 100. The stacking of cases 100 efficiently utilizes available space and minimizes the amount of cabling required to connect computing components. This stacking is illustrated in FIG. 7, which depicts portable rack-mounted electronics system 700, according to some embodiments. System 700 includes multiple cases 100 (three of which are shown in FIG. 7) that have been stacked to provide an exemplary computing configuration. The cases may include interlocking features to maintain the relative positions of the stacked cases.

The lids of the cases 100 have been removed and the cable management arms 122 have been extended to their deployed positions. The cables 110 that were looped within the conduits 130 in the manner shown in FIG. 6 have been routed to various termination points. As illustrated, the conduits of the three cable management arms 122 align forming a linear channel (raceway) 702 extending vertically. This allows cables to run directly up and down between stacked cases. The covers 138 of conduits 130 have been removed to facilitate cable routing. Once routing is completed, the covers 138 can be reinstalled to create an almost continuously enclosed raceway 702 running vertically along the stack. "Continuous" as used herein when referring to the channel extending along the aligned cable management arms, refers to the alignment of the channels of stacked cable management arms that enables cables routed within the channels to run substantially straight. A continuous channel, as used herein, includes a channel with breaks or space along its extension, such as the spaces between the arms in the stack, are generally small relative to the unbroken portions of the channel.

With the latches 140 in their latched positions, the cable management arms 122 are locked into their deployed positions, providing a rigid conduit for protecting the routed cables. Locking pins 142 may be inserted through the mating holes in the latches 140 and second arm portions 126 to lock the latches into their latched positions. This prevents accidental dislodging of the latches 140 from their latched positions. System 700 provides a durable, sturdy computing installation that can be quickly and easily installed in the field. The cable management arms 122 can be firmly locked in their deployed positions providing a sturdy cable management system without the need for nuts, bolts, or other fasteners to be installed in the field.

Figure 8A:
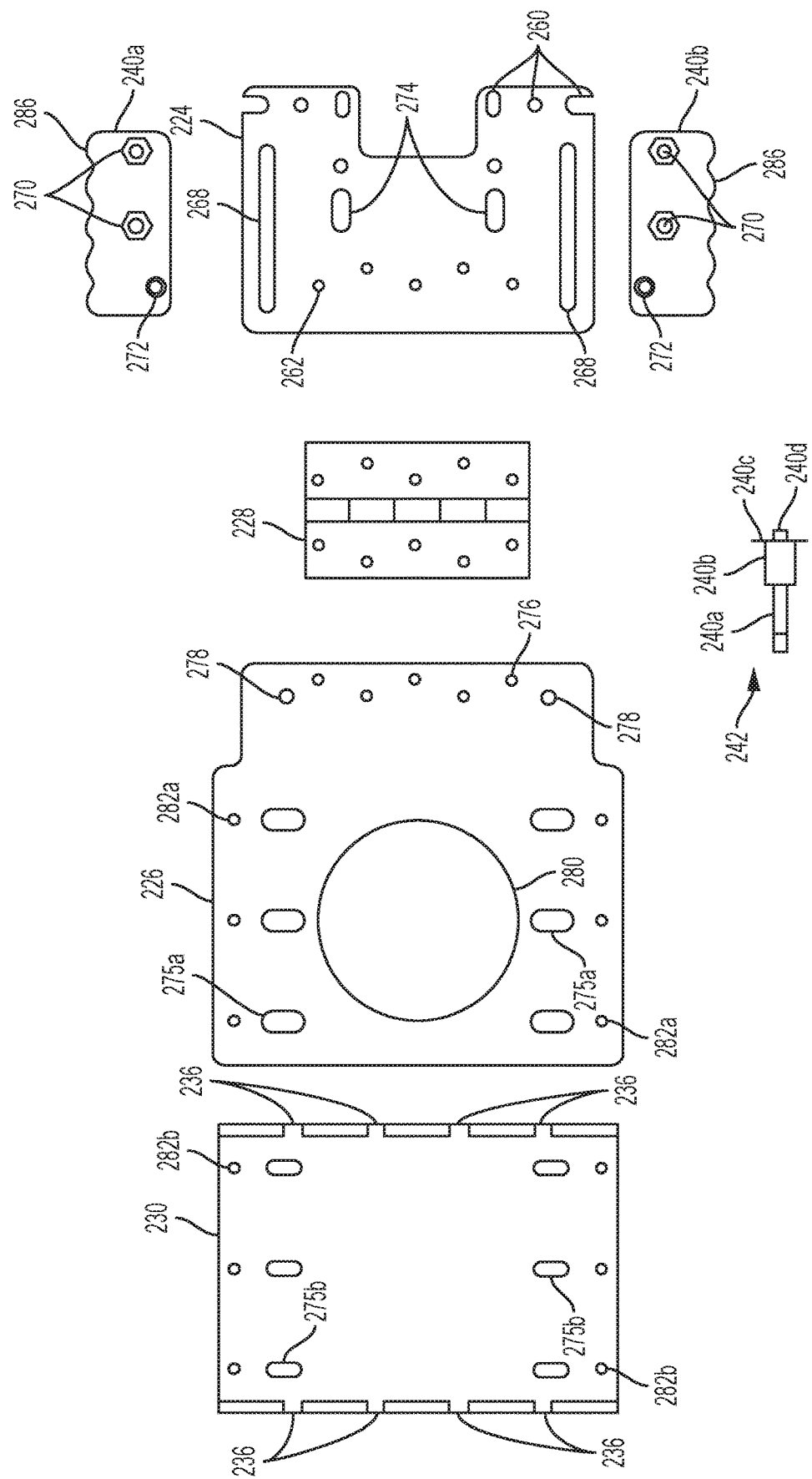
FIGS. 8A-8C illustrate a cable management arm, according to some embodiments.
Figure 8B:
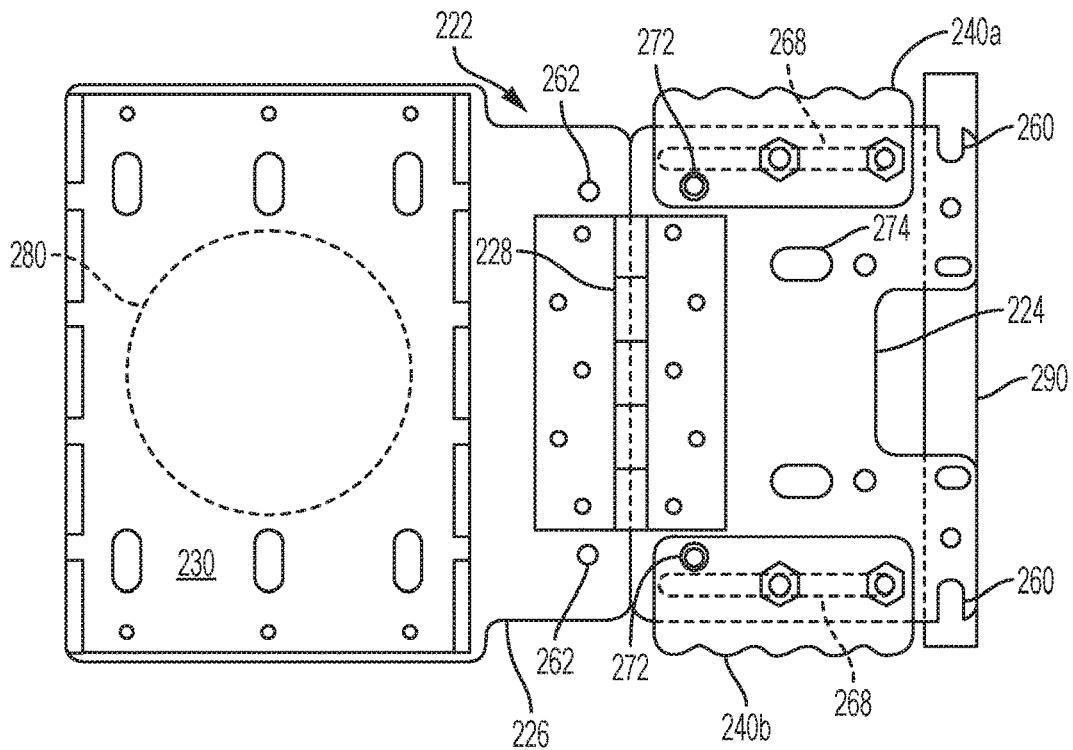
Figure 8C:
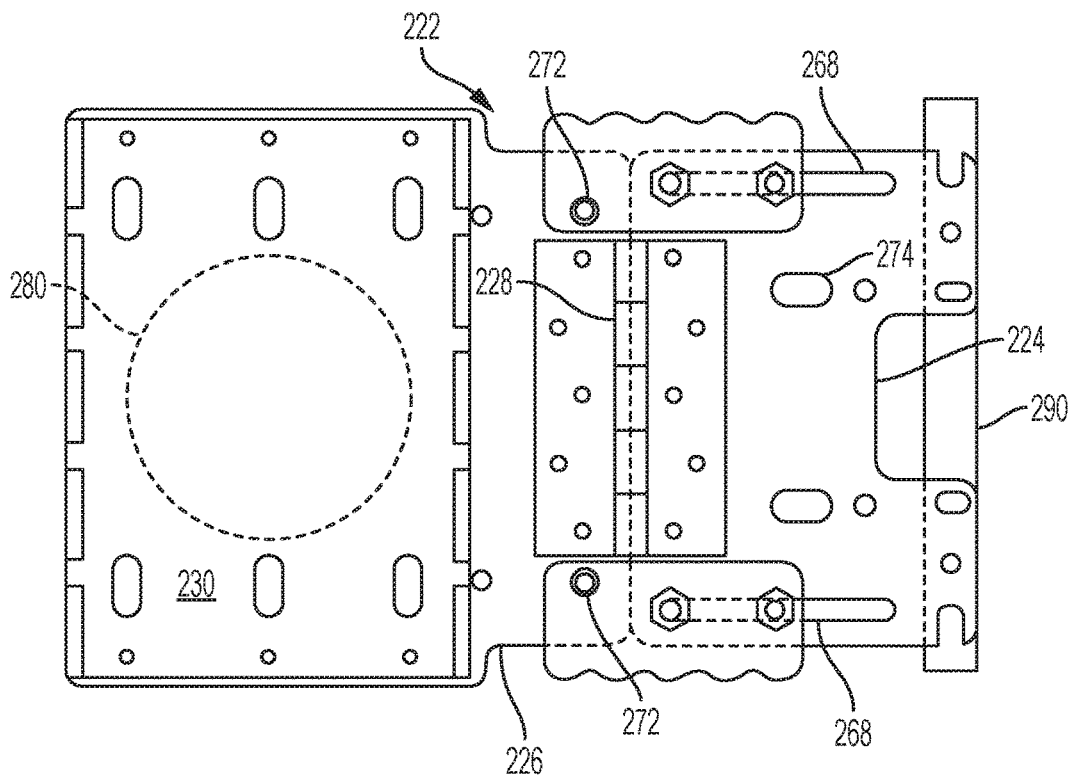

In some embodiments, conduit 130 need not be used as a guide for routing cables along the second arm portion 126. For example, the guide may be a plate or other substantially planar structure, an open channel, or any other structure that is configured to provide a guiding surface. Such embodiments provide a guiding surface for guiding the cables without requiring the depth of a conduit. This can reduce the overall depth of the arm when in the stowed position, which may be advantageous for mounting to smaller cases or enclosures. The guide may include one or more retainers for retaining the cables, enabling the cables to be routed along the guide. For example, hook-and-loop straps 160, cable ties, grooves, forked projections, or any other cable retaining structure can be mounted onto the guide surface to retain cables along the guide. For example, conduit 130 in the embodiments of FIGS. 1-7 may be left off of second arm portion 126 and cables may be routed along the plate to which the conduit 130 is mounted. Retainers (e.g., hook-and-loop straps 160) can strap the cables to the plate FIGS. 8A-8C illustrate components of cable management arm 222, according to one embodiment. Cable management arm 222 includes first bracket 224, second bracket 226, hinge 228, cable conduit 230, upper and lower latches 240a and 240b, and locking pin 242.

First bracket 224 is configured for mounting to a rack-mountable electronics enclosure, such as enclosure 100 of FIG. 1. First bracket 224 includes a plurality of mounting holes and/or slots 260 that are configured to align with corresponding features, such as threaded holes, in the enclosure. Fasteners may be used to mount the first bracket 224 to the enclosure. The first bracket 224 may be mounted to the enclosure using any other conventional means, such as by welding or brazing the bracket to the enclosure or to a feature mounted within the enclosure (e.g., a rack rail or post).

First bracket 224 also includes a plurality of hinge attachment holes 262 for attaching hinge 228 and two latch slots 268 used for attaching latches 240a and 240b. Pins or bolts can be inserted into holes 270 in latches 240a and 240b and then into latch slots 268 to attach the latches to first bracket 224, enabling the latches to slide side-to-side along the slot. The holes 270 in latches 240a,b may include hexagonal countersinks to rotationally fixing a nut or bolt head. Latches 240a and 240b each include locking pin hole 272, which is configured to receiving locking pin 242. In some embodiments, first bracket 224 includes holes and/or slots 274 for securing cables to first bracket 224. For example, holes or slots 274 can be used to attach cable ties, hook-and-loop fasteners, or any other components configured to retain cables.

Second bracket 226 includes hinge attachment holes 276 for attaching hinge 228 and conduit mounting holes 282a for attaching cable conduit 230. Locking pin holes 278 are included for insertion of locking pin 242 for locking latches 240a,b in the locked position. One or more cutouts 280 in second bracket 226 may be included for weight reduction. Although illustrated as a single circular cutout, weight-reduction cutouts can be of any size, shape, and number.

Cable conduit 230 can be mounted to second bracket 226 via holes 282b, which align with conduit mounting holes 282a. Holes and/or slots 275b can be included for aligning with holes/slots 275a in second bracket 226 for attaching features to secure cables within conduit 230, such as cable ties, hook-and-loop fasteners, or any other components configured to retain cables. Conduit 230 can include any number of slots 236 in one or more sides, which can be used to run cables into conduit 230 from the sides.

Locking pin 242 includes a pin portion 242a for inserting into holes in the latches 240a,b and the brackets 224,226 to prevent the latches 240a,b from sliding laterally. Locking pin 242 may include a shoulder portion 242b for abutting the side of the latches 240a,b to control the insertion depth of the pin portion 242a and a head portion 242c configured to enable a user to pull back on the locking pin 242 during removal. Locking pin 242 may include a detent at the end opposite of the head portion 242c to retain the locking pin in the holes into which it is inserted. The detent may be actuated via a button 242d protruding from the head portion 242c.

FIGS. 8B and 8C illustrate the components of cable management arm 222 in an assembled state. FIG. 8B illustrates cable management arm 222 with latches 240a and 240b in the unlatched position and FIG. 8C illustrates cable management arm 222 with latches 240a and 240b in the latched position.

Mounting holes and/or slots 260 of first bracket 224 are aligned with mounting feature 290 of an enclosure to which cable management arm 222 is attached. For example, mounting feature 290 may be a rail or post of a rack, a portion of the frame of the enclosure, a side of the enclosure, etc. Hinge 228 is attached to first and second brackets forming a pivoting joint between the brackets, allowing the second bracket 226 to swing or fold inward toward the enclosure on which the cable management arm 222 is mounted. Conduit 230 is affixed to the face of the second bracket 226.

Each of latches 240a,b includes a slot running down the center of the latch such that the latch has a u-shaped cross section. This enables the latch 240a,b to slide over the top/bottom of first and second brackets 224,226. When placed over the first bracket 224, the latches 240a,b are retained by inserting pins/bolts through holes 270 in latches 240a and 240b and through latch slots 268 in first bracket 224. Latch slots 268 allow the latches 240a,b can slide side-to-side along the upper and lower edges of first bracket 224.

In the unlatched position of FIG. 8B, the latches 240a and 240b are located toward the case attachment side of first bracket 224 such that a pin/bolt inserted into the hole 270 nearest the case attachment side abuts or is near the end of latch slot 268 nearest the case attachment side. In the latched position of FIG. 2C, the latches 240a and 240b have been moved laterally away from the case attachment side such that the latches bridge the joint between the first and second brackets 224,226. This prevents the first and second brackets 224,226 from rotating with respect to one another. In this position, a pin/bolt inserted into the hole 270 in the latches 240a,b farthest from the case attachment side is near the end of latch slot 268 that is nearest the hinge 228. In the latched position of FIG. 2C, locking pins 242 can be inserted through the locking pin hole 272 in latches 240a and 240b and through locking pin hole 278 of second bracket 226 to lock the latches 240a,b in the latched position.

In some embodiments, additional holes are included in first bracket 224 to allow for the insertion of locking pins 242 when the latches 240a,b are in the unlatched position. In some embodiments, only a single latch is used, rather than the two latches in the embodiment of FIGS. 2A-2C. As illustrated in the embodiment of FIGS. 2A-2C, the side surface 286 of the latches 240a,b can include a uneven profile or textured surface, or any other feature configured to enhance the user's ability to slide the latches into the latched and unlatched positions.

Figure 9A:
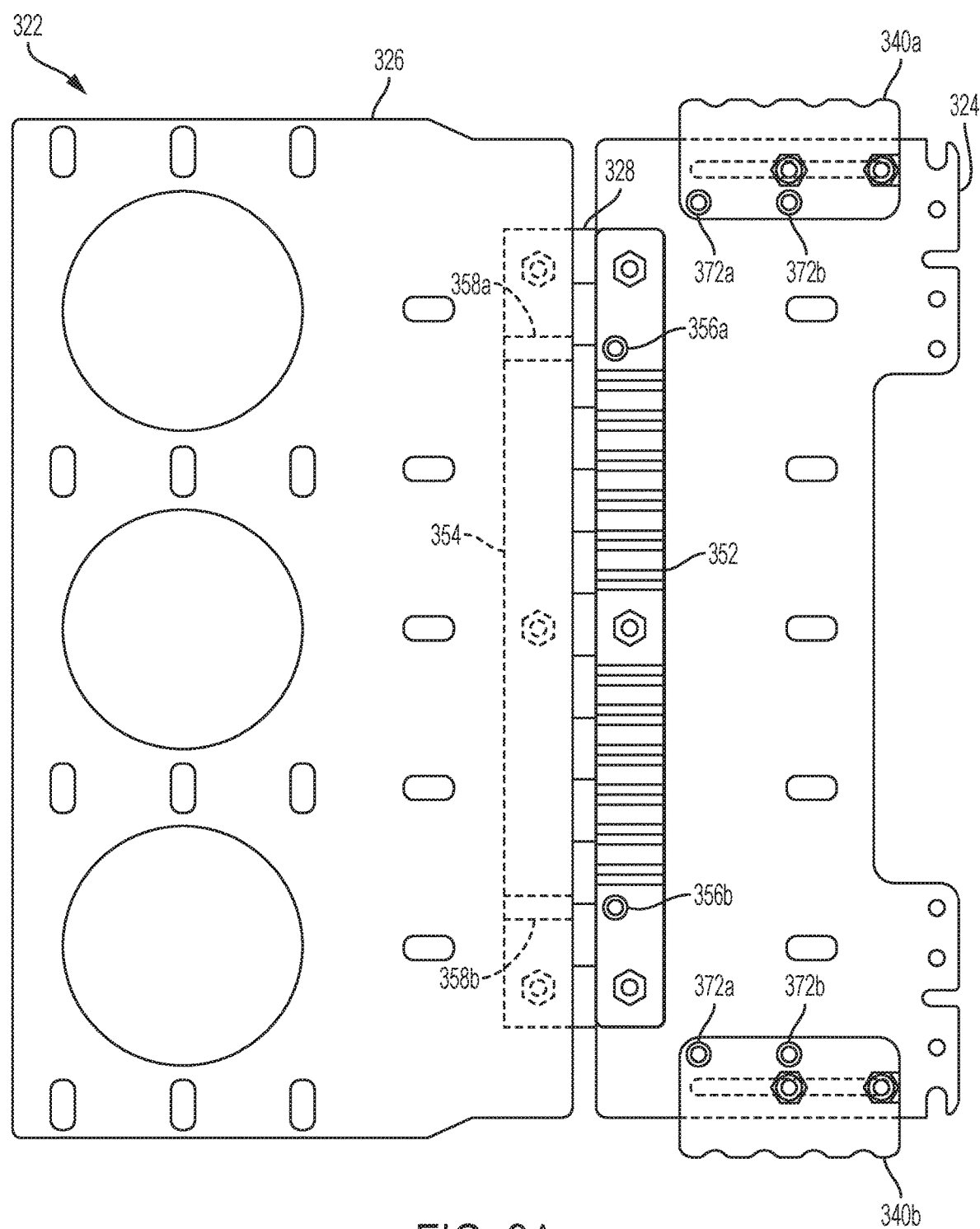
FIG. 9A illustrates a cable management arm that is configured to lock into two different deployed positions, according to some embodiments.
Figure 9B:
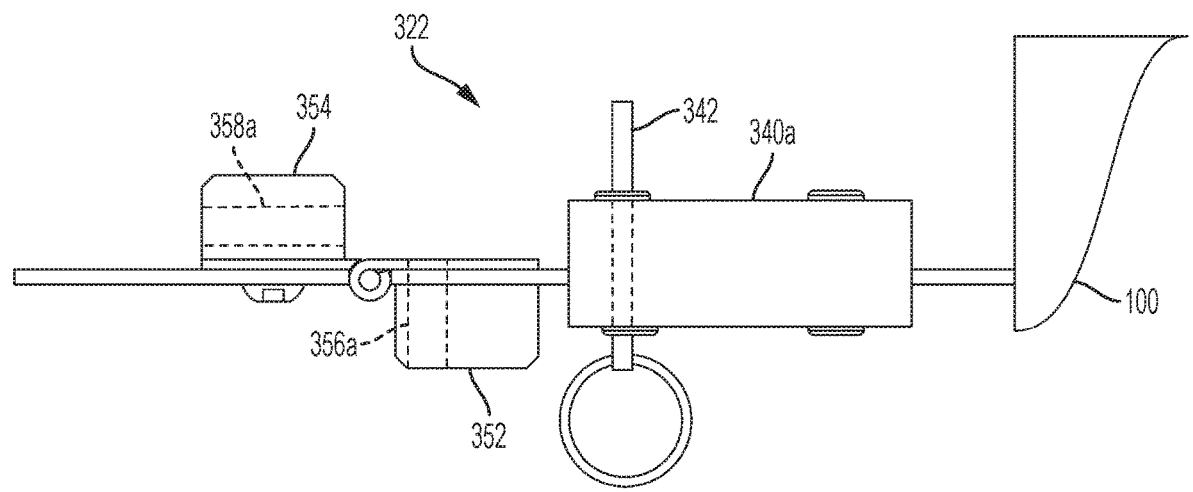
FIG. 9B illustrates a top view of the cable management arm of FIG. 9A in a first deployed position.
Figure 9C:
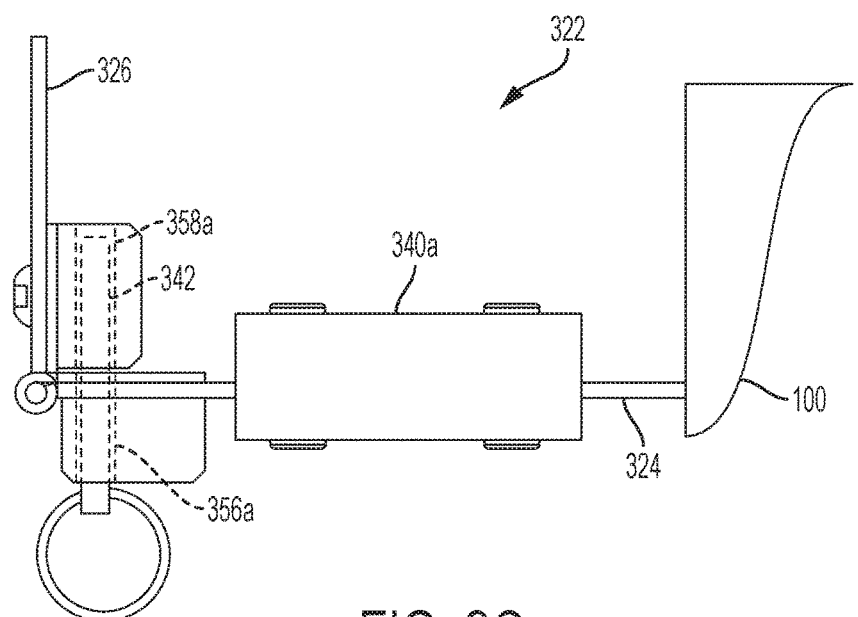
FIG. 9C illustrates a top view of the cable management arm of FIG. 9A in a second deployed position.

FIGS. 9A-9C illustrate cable management arm 322, according to another embodiment. Cable management arm 322 is configured for two deployed positions: a 90 degree position in which the second bracket 326 extends outwardly, 90 degrees from its stowed position (like the deployed position of cable management arm 222), and a 180 degree position in which the second bracket is rotated to 180 degrees from its stowed position. Cable management arm 322 is configured to latch in both the 90 degree deployed position and in the 180 degree deployed position. FIG. 9A is a side view of cable management art 322 and FIGS. 9B and 9C are top views of cable management art 322 extending from the opening of an enclosure.

Cable management arm 322 includes first bracket 324, second bracket 326, hinge 328, upper and lower latches 340a and 340b, and locking pin 342. These components are similar to those of cable management arm 222 discussed above and, thus, their detailed description is omitted for brevity. Cable management arm 322 also include first latching block 352 and second latching block 354, which as explained below, form a second latch for latching the cable management arm in the 180 degree deployed position.

First bracket 324 is configured for mounting to a rack-mountable electronics enclosure, such as enclosure 100 of FIG. 1. Upper and lower latches 340a and 340b mount to and slide along first bracket 324 in similar fashion to the upper and lower latches and first bracket of cable management arm 222. FIGS. 9A-9C illustrate upper and lower latches 340a and 340b in their unlatched position. Latches 340a and 340b each include two locking pin holes 372a,b. Locking pins 342 are inserted into locking pin holes 372a to lock the latches in the unlatched position (see FIG. 9B) and into locking pin holes 372b to lock the latches in the latched position when the second bracket 326 is in its 90 degree deployed position.

First bracket 324 and second bracket 326 are pivotally connected via hinge 328. Hinge 328 may be located on the back side of the brackets as shown in FIG. 9C and is configured to swing at least between a 90 degree position in which second bracket 326 is folded inward toward the enclosure for stowing and a 180 degree position in which the second bracket 326 is folded backward in the 180 degree deployed position, which is shown in FIG. 9C. Any other suitable means may be used to pivotally attach the first and second brackets for enabling a range of pivoting between the stowed position and the 180 degree deployed position.

First latching block 352 and second latching block 354 are mounted on opposite sides of the first and second brackets 324, 326 along the hinge end of the respective bracket, as illustrated in FIGS. 9B and 9C. First latching block 352 includes a pair of locking pin holes 356a,b that extend front-to-back through the latching block. First bracket 324 and hinge 328 include corresponding holes so that a continuous hole extends through them. Second latching block 354 includes a pair of locking pin holes 358a,b that extend side-to-side through the latching block. When the second bracket 326 is in its 180 degree deployed position, which is shown in FIG. 9C, the locking pin holes of the latching blocks align. Locking pins 342 can then be inserted through the aligned locking pin holes 356a,b and 358a,b to lock the second bracket 326 in the 180 degree deployed position, which is illustrated in FIG. 9C. In some embodiments, only one hole is included in each component for accommodating just a single locking pin. According to some embodiments, the same locking pin or pins may be used to lock the latch in the unlatched and latched positions and to lock the first and second brackets in the 180 degree deployed position. In other embodiments, separate locking pins, which may be configured the same or differently, may be used.

FIG. 9B illustrates cable management arm 322 with the second bracket 326 in the 90 degree deployed position and with the latch 340a in its unlatched position. Locking pin 342 is located in latching hole 372a to lock latch 340a in this position. FIG. 9C illustrates cable management arm 322 in the 180 degree deployed position with locking pin 342 inserted in locking pin holes 356a and 358a, as discussed above, such that the cable management arm 322 is locked in the 180 degree deployed position.

With its two deployed positions, cable management arm 322 offers the option of forming a raceway that extends perpendicularly to the case opening of stacked cases, similar to the configuration shown in FIG. 7, by deploying the cable management arms 322 of stacked cases in their 90 degree positions, and a raceway that extends parallel to the case opening of the stacked cases by deploying the arms in their 180 degree positions. The 180 degree deployed position may reduce the chances of personnel bumping into the raceway, which may be advantageous, for example, when the amount of space in front of a stacked set of cases is minimal.

Components of cable management arms may be made from any suitable material. For example, components may be made from aluminum, steel alloys, other metals or metal alloys, or suitable plastics such as Acrylonitrile butadiene styrene (ABS), Nylon, Polyamides (PA), Polybutylene terephthalate (PBT), Polycarbonates (PC), Polyetheretherketone (PEEK), Polyetherketone (PEK), Polyethylene terephthalate (PET), Polyimides, Polyoxymethylene plastic (POM/Acetal), Polyphenylene sulfide (PPS), Polyphenylene oxide (PPO), Polysulphone (PSU), Polytetrafluoroethylene (PTFE/Teflon), or Ultra-high-molecular-weight polyethylene (UHMWPE/UHMW). Components can be machined, molded, cast, stamped, formed by wire-EDM, 3D printed, or formed by any other suitable manufacturing method.

In some embodiments, the first and second arm portions, such as first and second brackets 224,226 are machined aluminum plates that may be anodized to protect from corrosion. In some embodiments, first arm portion 124 is formed as part of the case or as part of the rack within a case.

Components such as hinge 128 and locking pin 142 may be commercial-off-the-shelf (COTS) components or custom components. Any suitable size, style, and material of hinges and locking pins may be used. In some embodiments, such as arm 222 of FIGS. 8A-8C, a single COTS hinge is used to join the first and second arm portions 124,126. Hinges may be bolt-on hinges or weld-on hinges, or may be machined or otherwise formed directly into one or more of the first and second arm portions of the arm. Hinges may be piano hinges, mortise hinges, spring-loaded hinges, or any other suitable hinge style. Locking pins that may be used include ball lock pins, detent clevis pins, clevis pins with a hole for a cotter pin, wire lock pins, pull-ring detent pins, or any other suitable COTS or custom pin.

Various COTS or custom components may be used for strapping cables to the arm, including cable ties, hook-and-loop fasteners, and cable tie mounts to mount the cable ties on the arm. These cable strapping components may be integrated into any portion of the arm, including front and back side of the first and second arm portions, the hinge, and the cable conduit. Cable strapping components may be configured for any type and size of cables and/or wires typically used with rack-mounted electrical components, including copper and fiber-optic data cables and power cables.

The cable conduit may be a COTS component, such as any of several cable ducting configurations provided by Panduit™. Examples of duct configurations that may be used include hinged cover ducts, narrow slot ducts, wide slot ducts, solid wall ducts (no slots in one or more sides), round hole ducts with circular cutouts in the sides rather than slots, flexible ducts, rigid ducts, etc. The conduit/duct may be an integral feature of the second arm portion, for example, as a single machined unit or a single molded plastic unit. The conduit/duct may be of any suitable material, including any suitable metal or plastic.

Latches 140 may be made from any suitable metal or plastic. According to some embodiments, latches 140 are machined from a block of durable plastic material, such as Nylon, PC, UHMW, PEEK, etc. Use of such plastics can be advantageous when used with metal first and/or second arm portions to prevent binding and metal shavings. According to some embodiments, COTS latches such as catch latches, draw latches, keeper latches, etc., can be used in addition to or instead of the slide-style latches described above. In some embodiments, one or more latches that rotate, rather than slide, into latched and unlatched positions may be used.

As described above, an enclosure according to some embodiments can include a standard rack configuration. For example, a standard 19-inch rack configuration may include "posts" or "panel mounts" standing vertically, each being 0.625 inches (15.88 mm) wide and separated by a gap of 17.75 inches (450.85 mm), giving an overall rack width of 19 inches (482.60 mm). The posts may have holes at regular intervals, with both posts matching, so that each hole is part of a horizontal pair with a center-to-center distance of 18.312 inches (465.12 mm). The holes in the posts may be arranged vertically in repeating sets of three, with center-to-center separations of 0.5 inches (12.70 mm), 0.625 inches (15.88 mm), 0.625 inches (15.88 mm). The hole pattern may, thus, repeat every 1.75 inches (44.45 mm) (one rack unit). The cable management arm can be configured to mount to the standard rack built into an enclosure, for example, by including holes in a mounting bracket of the first arm portion that align with the hole patterns on the rack posts.

Although the channel 164 in the embodiments of FIGS. 1-7 is formed by conduit 130 having a rectangular cross section, channels can be formed with a structure having any cross sectional shape, including circular, oval, rectangular, square, etc., or any partial sections of these and any other cross-sectional shapes. The channel may be closed—i.e., formed from a continuous cross-sectional structure (e.g., conduit 130 with cover 138)—or may be open (e.g., conduit 130 without cover 138). Open channels may include one or more grooves or furrows. The structure forming the channel can include one or more solid walls or one or more cage-like structures.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims. Finally, the entire disclosure of the patents and publications referred to in this application are hereby incorporated by reference.

What is claimed as new and desired to be protected by Letters Patent of the United States is:

1. A cable management apparatus for a portable rack-mounted electronics enclosure, the apparatus comprising:
    a first arm portion configured to mount the apparatus to the portable rack-mounted electronics enclosure, the first arm portion having a first end for attachment to the portable rack-mounted electronics enclosure and a second end that is opposite the first end in a first direction;
    a second arm portion rotationally coupled to the second end of the first arm portion such that the second arm portion is configured to rotate relative to the first arm portion away from the enclosure from a folded position to an extended position, the second arm portion comprising a guide configured for guiding cables routed to electronics housed within the portable rack-mounted electronics enclosure, wherein the guide is mounted on a first side of the second arm portion and the first side faces an interior of the enclosure when the second arm is in the folded position, and the second arm portion is configured to rotate about an axis that extends vertically when the apparatus is positioned such that the first direction is a horizontal direction; and
    a latch mounted to the first arm portion or the second arm portion, the latch being movable to a latched position for preventing rotation of the second arm portion toward the folded position when the second arm portion is in the extended position and to an unlatched position for allowing rotation of the second arm portion relative to the first arm portion, wherein the first arm portion aligns with the second arm portion along a joint and the latch bridges at least a portion of the joint when in the latched position.

2. The apparatus of claim 1, further comprising a lock for locking the latch in the latched and unlatched positions.

3. The apparatus of claim 2, wherein the lock comprises a pin configured for insertion into a hole in the latch.

4. The apparatus of claim 3, wherein when the latch is in the unlatched position, the hole in the latch aligns with a hole in the first arm portion or the second arm portion, and wherein the pin is configured to be inserted through the hole in the latch and into the hole in the first arm portion or the second arm portion to lock the latch in the latched position.

5. The apparatus of claim 2, wherein the lock comprises a detent for retaining the lock in a locking position.

6. The apparatus of claim 1, further comprising a hinge for coupling the second arm portion to the first arm portion.

7. The apparatus of claim 1, wherein the enclosure comprises a rack for mounting modular computing components.

8. The apparatus of claim 7, wherein the enclosure is a portable case for transporting rack-mounted modular computing components mounted to the rack.

9. The apparatus of claim 1, wherein the enclosure includes a cover that can be installed to cover an opening of the enclosure when the second arm portion is rotated relative to the first arm portion toward the opening of the enclosure.

10. The apparatus of claim 1, wherein the cables comprise data communication cables.

11. The apparatus of claim 1, wherein the guide comprises a channel.

12. The apparatus of claim 1, wherein the guide comprises a plate comprising retainers for retaining the cables to the plate.

13. The apparatus of claim 1, wherein the guide comprises retainers configured to retain the cables on to the guide such that the retained cables are guided towards the enclosure when the second arm portion is moved from the first extended position or the second extended position to the folded position.

14. A portable enclosure for transporting rack-mounted electronics, the enclosure comprising:
    a housing comprising enclosed sides;
    a rack within the housing for mounting electronics within the housing;
    at least one cover configured to attach to the housing to close the enclosure so that when the at least one cover is attached to the housing, electronics mounted to the rack within are completely enclosed within the portable enclosure for transport; and a cable management arm mounted in the enclosure, the cable management arm comprising:
- a first arm portion having a first end configured to mount the arm to in the enclosure and a second end that is opposite the first end in a first direction,
- a second arm portion rotationally coupled to the second end of the first arm portion such that the second arm portion is configured to rotate relative to the first arm portion away from the enclosure from a folded position to an extended position, the second arm portion comprising a guide configured for guiding cables routed to electronics housed within the enclosure, wherein the second arm portion is configured to rotate about an axis that extends vertically when the housing is positioned such that the first direction is a horizontal direction, and
- a latch mounted to the first arm portion or the second arm portion, the latch being movable to a latched position for preventing rotation of the second arm portion toward the folded position when the second arm portion is in the extended position and to an unlatched position for allowing rotation of the second arm portion relative to the first arm portion.

15. The enclosure of claim 14, wherein the second arm portion in the folded position allows the cover to attach to the housing to close the enclosure.

16. The enclosure of claim 14, wherein the cover is configured to cover an opening of the enclosure when the second arm portion is rotated relative to the first arm portion toward the opening of the enclosure.

17. A portable rack-mounted electronics system comprising:
- at least two cases stacked in a stacking direction, wherein each case comprises:
  - enclosed sides;
  - a rack within the case for mounting electronics within the case;
  - at least one cover configured to attach to the case to close the case so that when the at least one cover is attached to the case, electronics mounted to the rack within are completely enclosed within the case for transport; and
  - a cable management arm mounted in the case and extending from an opening of the case, the cable management arm being movable about a joint of the cable management arm to a folded configuration and an extended configuration, the cable management arm comprising:
    - a slider configured to span the joint to prevent rotation of the cable management arm when cable management arm is in the extended configuration; and
    - a guide configured for guiding cables routed to electronics enclosed within the case, wherein the guide is mounted on a side of the cable management arm that faces an interior of the case when the cable management arm is in the folded configuration; and
  - wherein the guides of the stacked cases align to form a raceway extending in the stacking direction when the cable management arms of the stacked cases are in the extended configuration.

18. The system of claim 17, wherein the cable management arms are configured to lock in at least two extended configurations.

19. A cable management apparatus for a portable rack-mounted electronics enclosure, the apparatus comprising:
- a first arm portion configured to mount the apparatus to the portable rack-mounted electronics enclosure, the first arm portion having a first end for attachment to the portable rack-mounted electronics enclosure and a second end that is opposite the first end in a first direction;
- a second arm portion rotationally coupled to the second end of the first arm portion such that the second arm portion is configured to rotate relative to the first arm portion away from the enclosure from a folded position to a first extended position and a second extended position, the second arm portion comprising a guide configured for guiding cables routed to electronics housed within the portable rack-mounted electronics enclosure, wherein the second arm portion is configured to rotate about an axis that extends vertically when the apparatus is positioned such that the first direction is a horizontal direction;
- a first latch for latching the second arm portion relative to the first arm portion in the first extended position;
- a slider of the first latch configured to span a joint between the first arm portion and the second arm portion to prevent rotation of the second arm portion relative to the first arm portion when the second arm portion is in the first extended position; and
- a second latch for latching the second arm portion relative to the first arm portion in the second extended position.

20. The cable management apparatus of claim 19, wherein the first arm portion comprises a first receptacle and the second arm portion comprises a second receptacle, the first and second receptacles configured to align when the second arm portion is in the second extended position and to receive a pin for preventing rotation of the second arm portion relative to the first arm portion when the second arm portion is in the second extended position.

21. The cable management apparatus of claim 20, wherein the first latch is configured to receive the pin for locking the first latch in position.

\* \* \* \* \*